US007685687B2

(12) United States Patent
Borland et al.

(10) Patent No.: US 7,685,687 B2
(45) Date of Patent: Mar. 30, 2010

(54) METHODS OF MAKING HIGH CAPACITANCE DENSITY CERAMIC CAPACITORS

(75) Inventors: William Borland, Chapel Hill, NC (US); Lorri Drozdyk, Rougemont, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 41 days.

(21) Appl. No.: 11/625,481

(22) Filed: Jan. 22, 2007

(65) Prior Publication Data
US 2008/0172852 A1    Jul. 24, 2008

(51) Int. Cl.
*H01G 7/00* (2006.01)
*H05K 3/30* (2006.01)

(52) U.S. Cl. .................. 29/25.41; 29/25.03; 29/25.42; 29/830; 29/831; 361/321.2; 361/321.3; 438/393

(58) Field of Classification Search ........... 29/830–831, 29/846–847, 621.1, 25.01–25.03, 25.35–25.42; 174/255, 262; 361/313, 320, 321.2–321.3, 361/302, 303, 306.1–306.3; 438/400, 106, 438/123, 614, 393, 329
See application file for complete search history.

(56) References Cited

U.S. PATENT DOCUMENTS

| 3,878,443 | A | * | 4/1975 | Girard et al. ............. 361/320 |
| 4,528,613 | A |   | 7/1985 | Stetson et al. |
| 4,733,328 | A | * | 3/1988 | Blazej .................... 361/320 |
| 5,097,391 | A |   | 3/1992 | Nomura et al. |
| 5,261,153 | A | * | 11/1993 | Lucas ...................... 29/830 |
| 5,316,698 | A |   | 5/1994 | Tani et al. |
| 5,680,685 | A | * | 10/1997 | Bischoff ................. 29/25.42 |
| 6,631,551 | B1 | * | 10/2003 | Bowles et al. ............. 29/620 |
| 7,072,167 | B2 |   | 7/2006 | Borland et al. |
| 7,100,277 | B2 | * | 9/2006 | Borland et al. ............ 29/832 |
| 7,281,321 | B2 | * | 10/2007 | Kim et al. ................ 29/832 |
| 7,282,648 | B2 | * | 10/2007 | Kim et al. ............... 174/260 |
| 7,290,315 | B2 | * | 11/2007 | Palanduz et al. ......... 29/25.41 |
| 2003/0184953 | A1 | * | 10/2003 | Lee et al. ................ 361/312 |

FOREIGN PATENT DOCUMENTS

EP    0423738 B1    6/1996

OTHER PUBLICATIONS

European Search Report, European Application No. 07023856, Search Report Date: Mar. 26, 2008.

* cited by examiner

*Primary Examiner*—Minh Trinh

(57) ABSTRACT

Methods of making metal/dielectric/metal structures include casting copper slurry onto a fugitive substrate to form the first electrode and subsequently casting dielectric and copper slurries onto the first electrode, removing the fugitive substrate and co-firing the structure, wherein the dielectric comprises glass in an amount that is less than 20% by weight of the total inorganic composition and the dielectric achieves substantially complete densification. Alternatively, a metal tape and a dielectric tape, comprising glass in the above amount, may be formed and laminated together to form a metal/dielectric/metal green tape structure, which is co-fired, such that the structure achieves substantially complete densification.

8 Claims, 7 Drawing Sheets

METHODS OF MAKING HIGH CAPACITANCE DENSITY CERAMIC CAPACITORS

BACKGROUND

1. Technical Field

The technical field is ceramic capacitors. More particularly, the technical field is ceramic capacitors that may be embedded in printed wiring boards (PWBs).

2. Relevant Art

Passive circuit components embedded in printed wiring boards formed by "fired-on-foil" technology are known. Fired-on-foil capacitors are formed in the following way: a thick-film dielectric material layer is deposited onto a metallic foil substrate; a thick-film top electrode material is deposited over the thick-film dielectric material layer; and the thick-film dielectric and electrode are fired under copper thick-film firing conditions, such as 900° C. for 10 minutes under a protective atmosphere. U.S. Pat. No. 7,072,167 to Borland discloses such a process.

Copper foil and copper thick-film conductive compositions are known materials in making fired-on-foil capacitors because copper is compatible with printed wiring board processes. The thick-film dielectric material should have a high dielectric constant (K) after firing. A high dielectric constant thick-film dielectric is formed by mixing a high dielectric constant powder (high K functional phase), such as barium titanate, with a glass powder and suitable dopants and dispersing the mixture into a thick-film screen-printing vehicle.

During firing of the thick-film dielectric material, the glass component of the dielectric material softens and flows before the peak firing temperature is reached. The glass encapsulates the high K functional phase, facilitates the incorporation of the dopants into the crystal structure and bonds the dielectric to the copper foil and to the copper top electrode.

Being a rigid substrate, the copper foil essentially eliminates the firing shrinkage of the dielectric in the x-y direction. This means that during firing on copper foil of the dielectric and the top electrode, shrinkage occurs only in the z direction. And, precisely in order to achieve high density of the dielectric by shrinkage in the z direction alone, typical thick-film dielectric compositions are designed to contain substantial amounts of glass, such as greater than 40% by weight of the inorganic composition.

Such substantial amount of glass facilitates densification by forming a liquid phase. At concentrations such as 40% by weight of the total inorganic content, the functional phase, dopants and glass mixture are together sufficiently fluid to easily flow and contract in the z direction to full density. However, this amount of glass severely dilutes the high K phase, resulting in a significantly reduced dielectric constant. This dilutive effect introduces a balancing tension between that amount of glass added to the dielectric for achieving high densification versus that amount added to the dielectric for minimizing reduction of the dielectric constant.

Thus, when the glass content is minimized, typically to less than 20% by weight of the total inorganic composition and preferably much less than that, to achieve satisfactory composite dielectric constants, the functional phase, dopants and glass mixture has a very high viscosity and does not easily flow. Therefore little contraction in the z direction occurs, resulting in incomplete densification of the dielectric. This compromises the long-term reliability of the capacitor.

Consequently, a problem that remains to be solved in fired on foil capacitors is the use of a minimal amount of glass to maintain a high dielectric constant and the creation of a method to minimize the amount of added glass while achieving substantially complete densification of the dielectric.

SUMMARY

This problem is solved by the methods described herein of making fired on foil capacitors such that the capacitor structure achieves high density and yet contains a minimal amount of glass in the dielectric. One method described herein of making a metal/dielectric/metal structure for embedded capacitors comprises:

forming a metal green tape;

casting and drying dielectric slurry onto the metal green tape;

casting and drying copper slurry onto the dried dielectric layer to form a metal/dielectric/metal green tape structure;

firing the structure.

On firing, the structure shrinks in three dimensions allowing the dielectric to achieve high density with a minimal amount of glass in the dielectric.

The dielectric comprises glass in an amount that is less than 20% by weight of the total inorganic composition and the ceramic dielectric achieves substantially complete densification. The metal is selected from the group consisting of copper and nickel and their alloys.

Another method described herein of making a structure for embedded capacitors comprises:

forming a metal green tape, providing a dielectric green tape;

laminating the tapes together to form a metal/dielectric/metal green tape structure.

On firing, the structure shrinks in three dimensions allowing the dielectric to achieve high density with a minimal amount of glass in the dielectric.

Again, the dielectric comprises glass in an amount that is less than 20% by weight of the total inorganic composition and the ceramic dielectric achieves substantially complete densification. The metal is selected from the group consisting of copper and nickel and their alloys.

These methods also include, once the metal/dielectric/metal structure is made, etching the metal on at least one side of the structure to define capacitor electrodes prior to incorporation into a printed wiring board. Further, the invention also contemplates incorporating the ceramic capacitor structure made by the above methods into a printed wiring board, thereby providing a printed wiring board with embedded ceramic capacitors.

BRIEF DESCRIPTION OF THE DRAWINGS

The detailed description refers to the following drawings, wherein like numerals refer to like elements, and wherein:

FIG. 2A-1D illustrates another general method of making a copper/dielectric/copper structure.

DETAILED DESCRIPTION

The following methods are described herein with reference to the definitions provided below:

As used herein, a "minimal amount of glass" refers to less than 20% by weight of the inorganic composition.

As used herein, a "copper green tape" refers to a flexible free standing film that comprises copper powder, an organic carrier resin and plasticizer and is in the unfired condition.

As used herein, a "dielectric green tape" refers to a flexible free standing film that comprises a mixture of inorganic dielectric powders, glass powder, an organic carrier resin and plasticizer and is in the unfired condition.

As used herein, the terms "high K functional phase powders" and "high dielectric constant powders" are interchangeable and refer to powders that exhibit high dielectric constants in the bulk form. These powders typically comprise perovskite-type ferroelectric compositions with the general formula $ABO_3$. Examples of such compositions include $BaTiO_3$; $SrTiO_3$; $PbTiO_3$; $CaTiO_3$; $PbZrO_3$; $BaZrO_3$ and $SrZrO_3$. Other compositions are also possible by substitution of alternative elements into the A and/or B position, such as $Pb(Mg_{1/3}\ Nb_{2/3})O_3$ and $Pb(Zn_{1/3}Nb_{2/3})O_3$. $TiO_2$ and $SrBi_2Ta_2O_9$ are other possible high K materials.

As used herein, the term "dopants" refers to additives to the dielectric composition that are used to achieve the necessary end-use property specifications such as the necessary temperature coefficient of capacitance (TCC) in order for the material to meet industry definitions, such as "X7R" or "Z5U" standards.

As used herein, the term "substantially complete" refers to a quality of densification of the dielectric described herein that has no interconnected porosity.

Figure 1A:
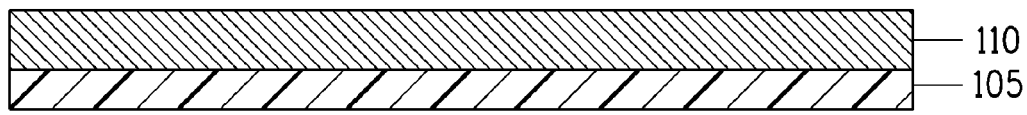
FIG. 1A-1D illustrates one general method of making a copper/dielectric/copper structure.
Figure 1B:
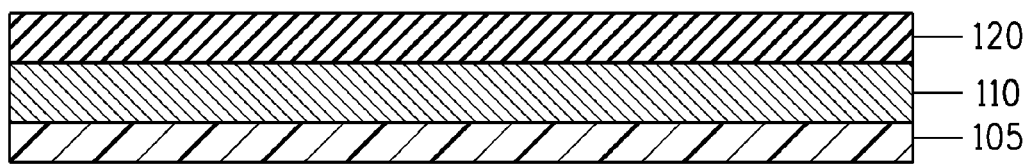
Figure 1C:
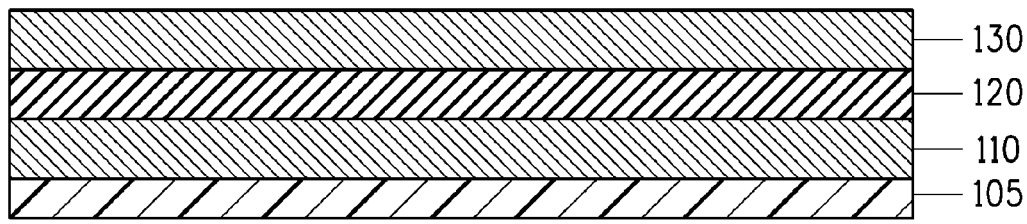
Figure 1D:
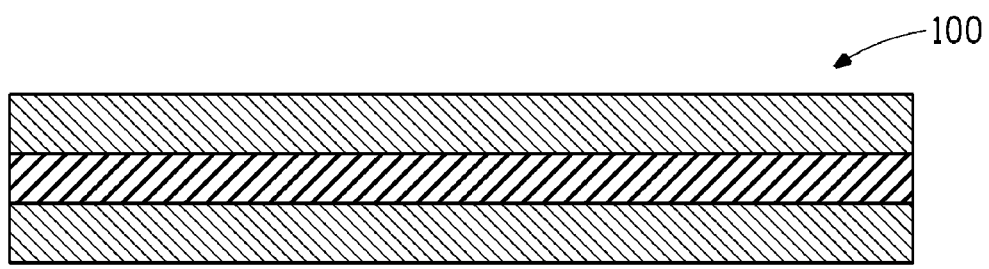

FIGS. 1A-1D illustrate a general method of making a metal/dielectric/metal structure that contains glass in an amount that is less than 20% by weight of the total inorganic composition and the ceramic dielectric will achieve substantially complete densification. FIG. 1A is a side elevational view of the first stage of making copper/dielectric/copper structure 100 (FIG. 1D). In FIG. 1A, copper green tape 110 has been formed on Mylar® sheet 105, which acts as a fugitive substrate. Other metals may be used, such as nickel, but copper is preferred.

Tape 110 is made by casting and drying copper slurry containing an organic carrier binder resin, a plasticizer, a solvent and copper powder onto silicon coated Mylar® sheet. One formulation that may be used for a copper slurry is:

| | |
|---|---|
| Ethyl acetate | 121.36 g |
| Medium A | 59.85 g |
| Plasticizer | 4.9 g |
| Surfactant | 2.52 g |
| Copper powder | 584.84 g |

Medium A comprises: 35% acrylic binder/65% ethyl acetate.

The acrylic binder comprises a suitable mixture of ethyl methacrylate, methyl acrylate and methacrylic acid. The proportions of each component in the acrylic binder, and the amounts of binder and plasticizer, may be varied to form the appropriate slip viscosity and unfired tape characteristics when used with the copper powder.

Plasticizer comprises: Benzoflex® Plasticizer obtainable from Velsicol Chemical Company.

The composition may be ball-milled for approximately two hours then discharged from the ball mill. The medium, plasticizer, and solvent may be added in two steps to obtain a low viscosity at the ball-milling stage for good powder dispersion and an appropriate viscosity at the second stage for casting.

The thickness of tape 110 may be, for example, in the range between about 8 and 100 microns and preferably between 8 and 50 microns. This latter range corresponds to between 5 and 35 microns for the fired copper thickness which is similar to copper foil dimensions commonly used in printed wiring board circuits.

In FIG. 1B, first dielectric layer 120 is formed over copper tape 110 by casting and drying a dielectric slurry onto copper tape 110. The dielectric slurry may be, for example, a composition containing barium titanate, glass, dopants, a carrier resin, plasticizer and solvents.

One composition that may be used for the dielectric slurry is:

| | |
|---|---|
| Ethyl acetate | 77.08 g |
| Medium A | 20.11 g |
| Barium titanate | 215.65 g |
| Glass | 38.54 g |
| Lithium fluoride | 3.16 g |
| Barium fluoride | 4.28 g |
| Zinc fluoride | 2.32 g |
| Magnesium oxide | 0.49 g |
| Plasticizer | 3.37 g |

Medium A comprises: 35% by weight acrylic binder resin and 65% by weight ethyl acetate The acrylic binder comprises a suitable mixture of ethyl methacrylate, methyl acrylate and methacrylic acid. The proportions of each component in the acrylic binder, and the amounts of binder and plasticizer, may be varied to form the appropriate slip viscosity and unfired tape characteristics when used with the powders used in the dielectric composition.

Plasticizer comprises Benzoflex® Plasticizer obtainable from Velsicol Chemical Company Glass Comprises:

| | |
|---|---|
| Germanium oxide | 21.5% |
| Lead oxide | 78.5% |

The glass used herein corresponds to $Pb_5Ge_3O_{11}$. The above composition may be ball-milled for approximately 16 hours to suitably disperse the mixture for casting.

The thickness of dielectric layer 120 is preferably in the range of between about 1½ microns and 30 microns which corresponds to between 1 and 20 microns for the fired dielectric thickness.

In FIG. 1C, copper layer 130 is formed over dielectric layer 120. Other metals may be used, such as nickel, but copper is preferred. Copper layer 130 may be formed by casting and drying on to dielectric layer 120 the same copper slurry composition used in making copper green tape 110. The thickness of tape 130 may be, for example, in the range between about 8 and 100 microns and preferably between 8 and 50 microns.

This latter range corresponds to between 5 and 35 microns for the fired copper thickness which is similar to copper foil dimensions commonly used in printed wiring board circuits.

Mylar® sheet 105 is then removed. Copper tape 110, dielectric layer 120, and copper layer 130 are then fired under copper thick-film firing conditions. If the combined thickness of copper tape 110, dielectric layer 120, and copper layer 130 is such that the burn out of the carrier resin and plasticizer takes a long time, some form of burn out heating profile may be used before firing under copper thick-film firing conditions. Such a burn out profile may be, for example, a slow ramp up over 4 hours to 400° C. This will effectively remove most of the organic material. Other firing profiles may also be used depending upon materials used in the compositions. For example, firing for longer times and/or higher temperatures may be utilized. Higher temperatures and times would allow for lower glass contents to be used. Such options allow for optimization of the compositions to allow for minimal glass contents.

During firing, the glass phase in the dielectric softens, wets the functional and dopant phases and promotes liquid phase sintering. At the same time, copper tape 110 and copper top layer 130 begin to sinter. In addition, the copper forms a strong bond to the dielectric layer. The post-fired structure 100 is shown in front elevation in FIG. 1D.

The mechanism behind needing less glass for densification is this: Under copper thick-film firing conditions, the drive to reduce surface energy becomes strong in copper as the firing temperature gets close to its melting point. This drive results in strong sintering forces and considerable shrinkage in all dimensions. The shrinkage in the x-y dimension of the copper results in a similar shrinkage in the x-y dimension of the dielectric. The shrinkage in the x-y dimension of the dielectric results in the reduction of the dielectric inter-particle distance, with concomitant less movement of material needed for densification. This in turn means that less glass is needed for densification and facilitates making highly dense dielectrics with less glass.

Figure 2A:
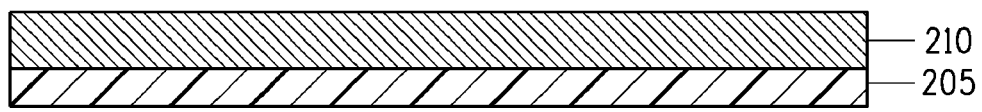

FIG. 2A is a side elevational view of a first stage of making copper/dielectric/copper structure 200 (FIG. 2D) using an alternative method. In FIG. 2A, copper green tape 210 has been formed on Mylar Sheet® 205. Other metals may be used, such as nickel, but copper is preferred. Copper green tape 210 may be formed by casting and drying on to Mylar® sheet 205 the same copper slurry composition used in making copper green tape 110. The thickness of tape 210 may be, for example, in the range of about between 8 and 100 microns and preferably between 8 and 50 microns. The latter range corresponds to between 5 and 35 microns for the fired copper thickness.

Figure 2B:

In FIG. 2B, dielectric green tape 220 has been formed on Mylar Sheet® 205. Dielectric tape 220 may be formed by casting and drying onto silicon coated Mylar® sheet 205 the same dielectric slurry used in forming dielectric layer 120. The thickness of dielectric tape 220 is preferably in the range of between about 1½ microns and 30 microns which corresponds to between 1 and 20 microns for the fired dielectric thickness.

Figure 2C:
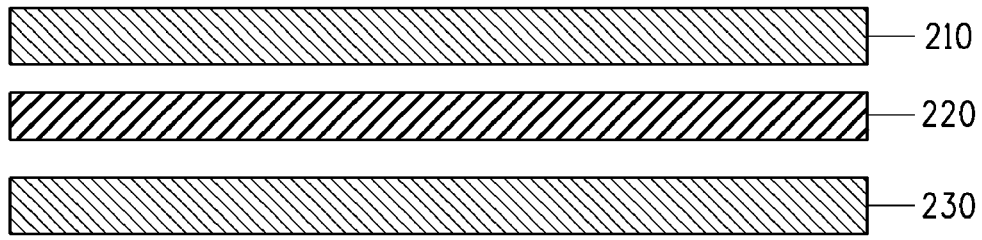
Figure 2D:
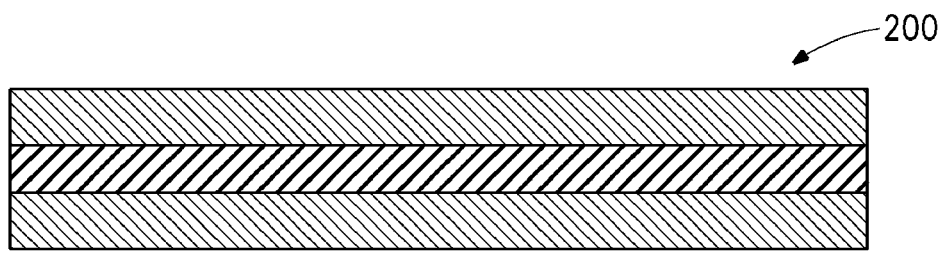

In FIG. 2C, the Mylar® sheet is removed from the dielectric and the copper. Copper tape 210 is laminated to both sides of dielectric tape 220 and fired under copper thick-film firing conditions to form copper/dielectric/copper structure 200. If the combined thickness of copper tape 210, dielectric layer 220, and second copper layer 230 is such that the burn out of the carrier resin and plasticizer takes a long time, some form of burn out heating profile may be used before firing under copper thick-film firing conditions. Such a burn out profile may be, for example, a slow ramp up over 4 hours to 400° C. This will effectively remove most of the organic material. Other firing profiles may also be used depending upon materials used in the compositions. For example, firing for longer times and/or higher temperatures may be utilized. Higher temperatures and times would allow for lower glass contents to be used. Such options allow for optimization of the compositions to allow for minimal glass contents.

During firing, the glass phase in the dielectric softens, wets the functional and dopant phases, promotes liquid phase sintering and the dielectric begins to densify and shrink. At the same time, the copper tapes begin to sinter and shrink. The shrinkage in all three dimensions of the copper and dielectric on firing allows for a highly dense dielectric and copper layers to be formed. In addition, the copper has a strong bond to the dielectric layer. The post-fired structure 200 is shown in front elevation in FIG. 2D.

Embedding Capacitors into PWBs

Figure 3A:
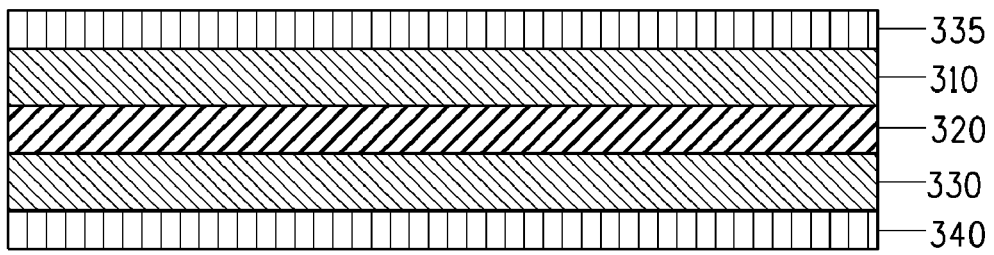
FIG. 3A-3G illustrates a method of defining individual capacitors from the copper/dielectric/copper structure and embedding them into a printed wiring board.
Figure 3B:
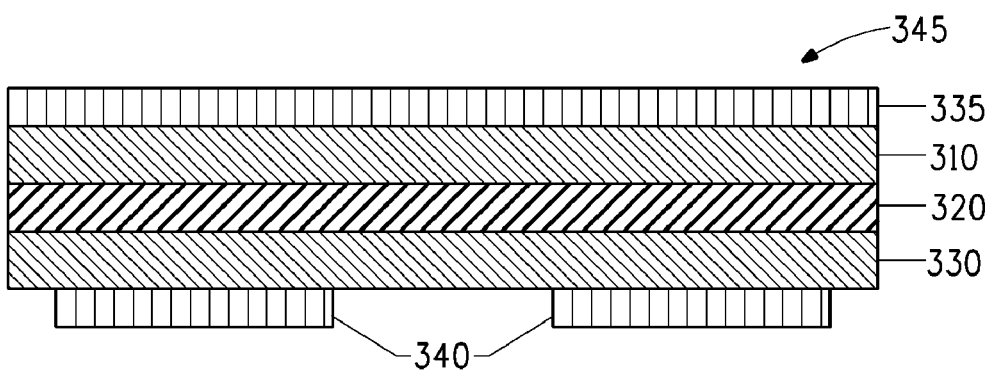
Figure 3C:
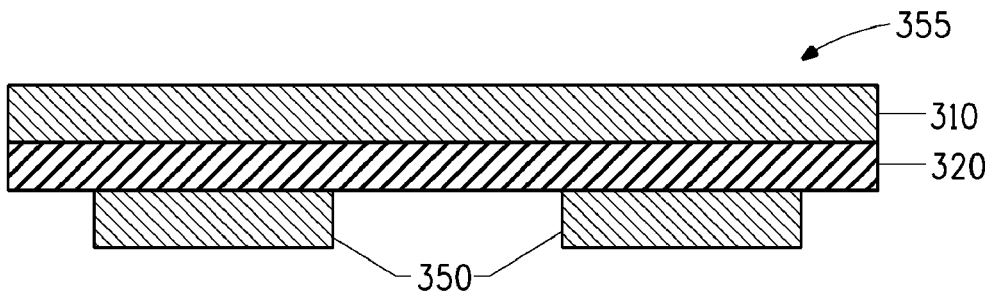

Methods for creating individual capacitors from copper/dielectric/copper structures 100 and 200 described above and for embedding them into printed wiring boards include first etching the copper on one side of the copper/dielectric/copper structure to define the first electrodes of the capacitors formed from the structure. For example, in FIG. 3A, photoresists 335 and 340 are applied to copper foils 310 and 330. Photoresists 335 and 340 are imaged and developed to form structure 345 in FIG. 3B. Copper foil 330 is ten etched and the remaining photoresist stripped to define first electrodes 350 and form structure 355 in FIG. 3C. As shown, copper foil 310 remains un-etched so as to provide strength to the structure. Depending upon the capacitor design, copper foil 310 may also be etched to define electrodes as long as no unsupported dielectric is produced.

Figure 3D:
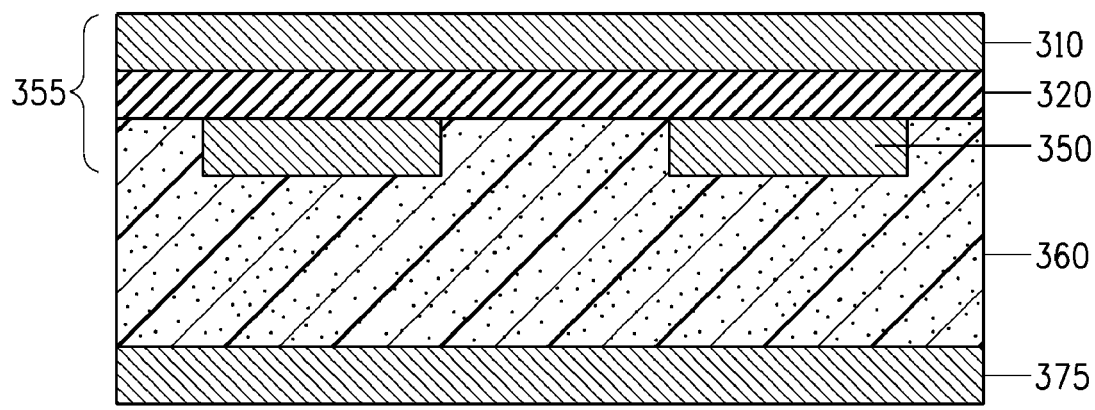

In FIG. 3D, first electrode 350 side of structure 355 can be laminated with laminate material 360 and copper foil 375. The lamination can be performed, for example, using FR4 prepreg using standard printing wiring board processes. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide insulation between circuit layers. In one variant of these methods, 106 epoxy prepreg may be used.

Suitable lamination conditions are 185° C. at 208 psig for 1 hour in a vacuum chamber evacuated to 28 inches of mercury. A silicone rubber press pad and a smooth PTFE filled glass release sheet may be in contact with the foils to prevent the epoxy from gluing the lamination plates together.

Figure 3E:
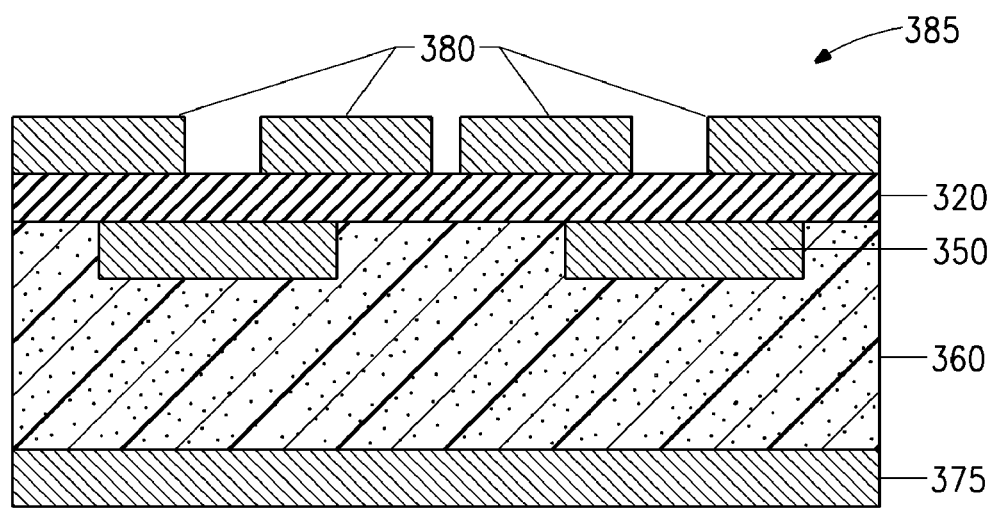

After lamination, a photoresist (not pictured) may be applied to fail 310 and to foil 375. The photoresist is imaged and developed and foil 310 is etched and the remaining photoresist stripped using standard printing wiring board processing conditions to form capacitor structure 385 in FIG. 3E. The etching produces second electrodes 380. Foil 375 remains un-etched at this stage.

Figure 3F:
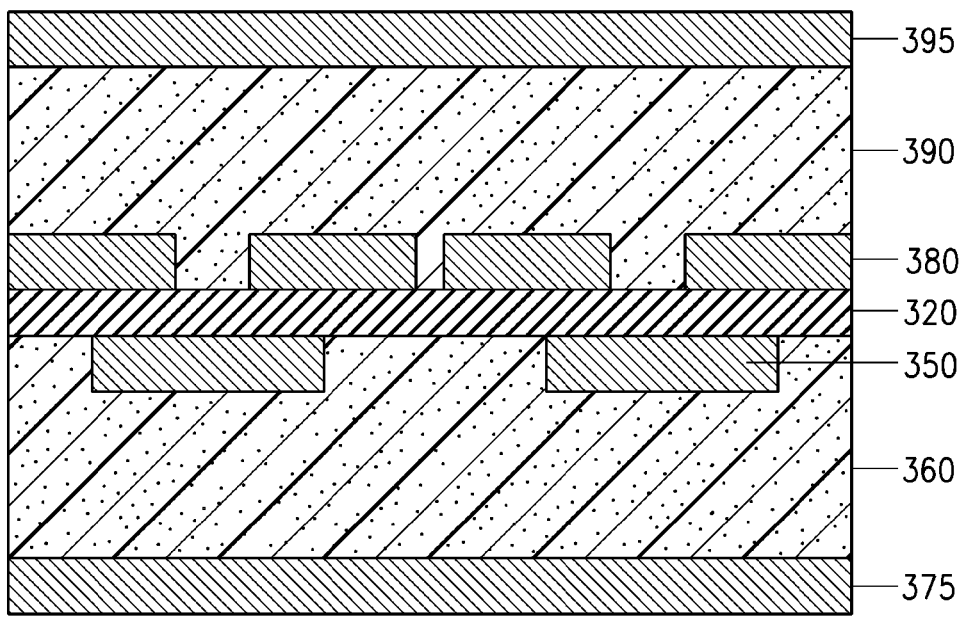
Figure 3G:
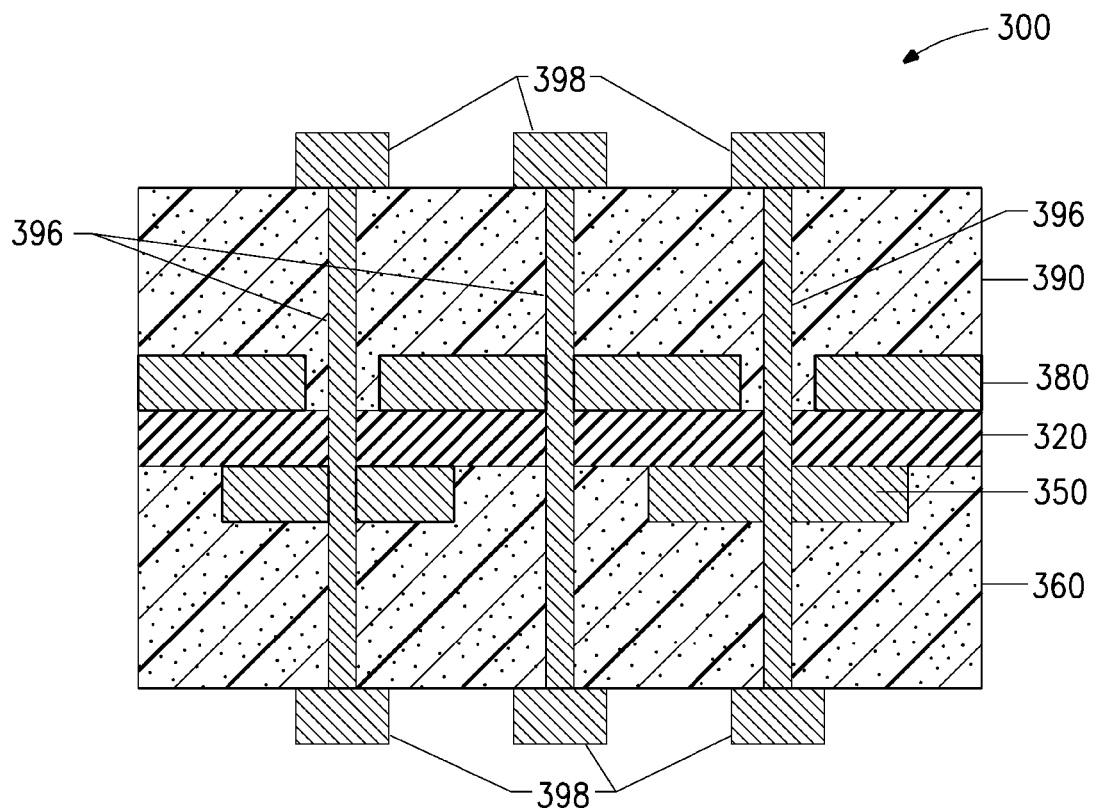

In FIG. 3F, electrode 380 side of capacitor structure 385 is laminated with laminate material 390 and foil 395. The lamination may be performed as previously described. Through holes 396 may now be drilled and plated to connect first and second electrodes, 350 and 380, respectively, with surface pads 398 to complete the final capacitor structure 300 shown in FIG. 3G. Other methods and designs may be implemented to form final structure 300.

In addition, once the final ceramic capacitor structure is formed, an important application for it is incorporation into a printed wiring board, which is well within the ordinary skill of those skilled in this art. This invention includes not only the methods described herein that result in a ceramic capacitor structure but also a printed wiring board into which the structure has been incorporated.

EXAMPLES

Example 1

A copper/dielectric/copper structure was fabricated using the method as described in FIGS. 1A-1D. A copper slurry was manufactured by ball-milling for 2 hours a mixture consisting of the following components:

| | |
|---|---|
| Ethyl acetate | 117.28 g |
| Medium A | 11.6 g |
| Plasticizer | 4.9 g |
| Surfactant | 2.52 g |
| Copper powder | 584.84 g |

After discharging the slurry, 48.25 grams of medium A and 4.08 grams of ethyl acetate was added to the composition. The formulation was stirred for approximately 30 minutes to disperse the mixture. A portion of the slurry was then cast onto Mylar® sheet and dried at 120° C. for approximately 30 minutes to form a copper tape structure on Mylar® sheet.

A dielectric slurry was manufactured by ball-milling for 16 hours the following composition:

| | |
|---|---|
| Ethyl acetate | 77.08 g |
| Medium A | 20.11 g |
| Barium titanate | 215.65 g |
| Glass | 38.54 g |
| Lithium fluoride | 3.16 g |
| Barium fluoride | 4.28 g |
| Zinc fluoride | 2.32 g |
| Magnesium oxide | 0.49 g |

After discharging the dielectric slurry, 3.37 grams of Benzoflex® Plasticizer was added and the composition was stirred for 2 hours. The composition was then cast onto the copper tape on Mylar® sheet and was dried at 120° C. for approximately 30 minutes to form a dielectric tape structure on copper tape, which is on Mylar® sheet.

The copper slurry remaining from the first copper layer was then cast onto the dielectric tape and dried at 120° C. for approximately 30 minutes to form a structure of copper tape on dielectric tape on copper tape, which is on Mylar® sheet.

The thicknesses of the copper, dielectric and copper top layer were targeted to be similar to the dimensions of a standard thick-film "fired-on-foil" capacitor structure when fired.

Figure 4:
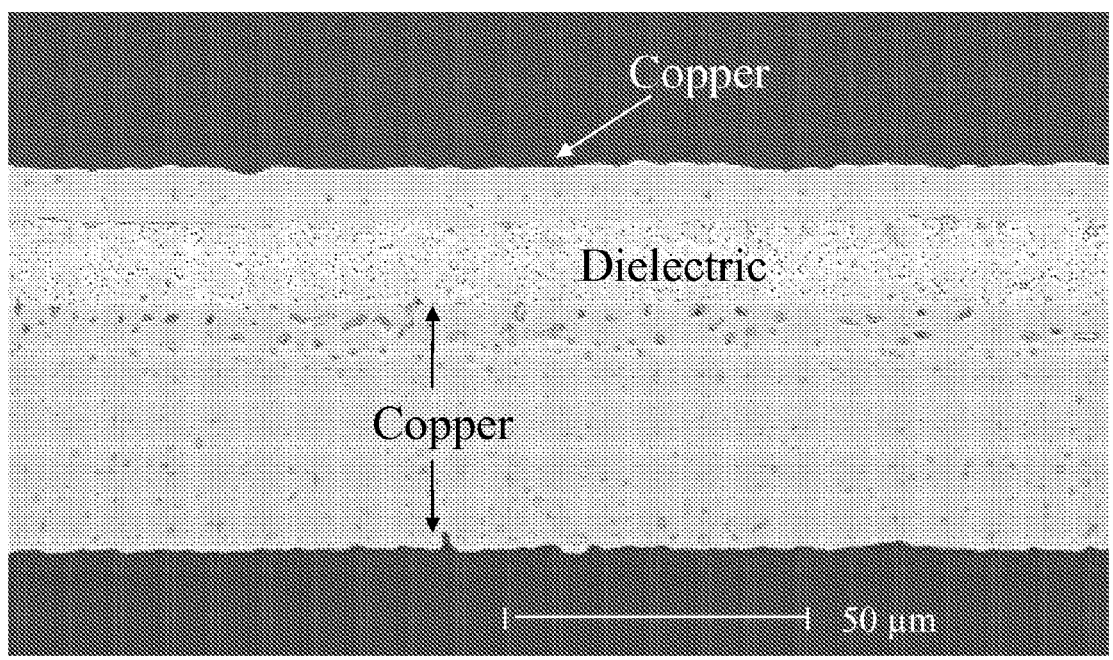
FIG. 4 illustrates a cross-section of a copper/dielectric/copper structure made by the methods described herein and showing substantially complete densification of the dielectric.

The Mylar® sheet was stripped from the structure creating a copper tape on dielectric tape on copper tape structure. One inch by one inch square samples were cut from the structure. The samples were subjected to a burn out profile of a slow ramp up over 4 hours to 400° C. in nitrogen followed by firing at 900° C. in nitrogen for 10 minutes at peak using standard copper thick-film firing conditions. The resulting fired copper/dielectric/copper structure was cross-sectioned to examine the dielectric density. The cross section is shown in FIG. 4.

Example 2

A thick-film "fired-on-foil" capacitor was fabricated using the same inorganic compositions as used in example 1 but using thick-film screen printed paste formulas and processes. Thus, this example represents prior art methods of making fired-on-foil capacitors. The capacitor was fired at 900° C. under copper thick-film firing conditions. A cross section was also performed and shown in FIG. 5.

Comparison between Example 1 and Example 2

Figure 5:
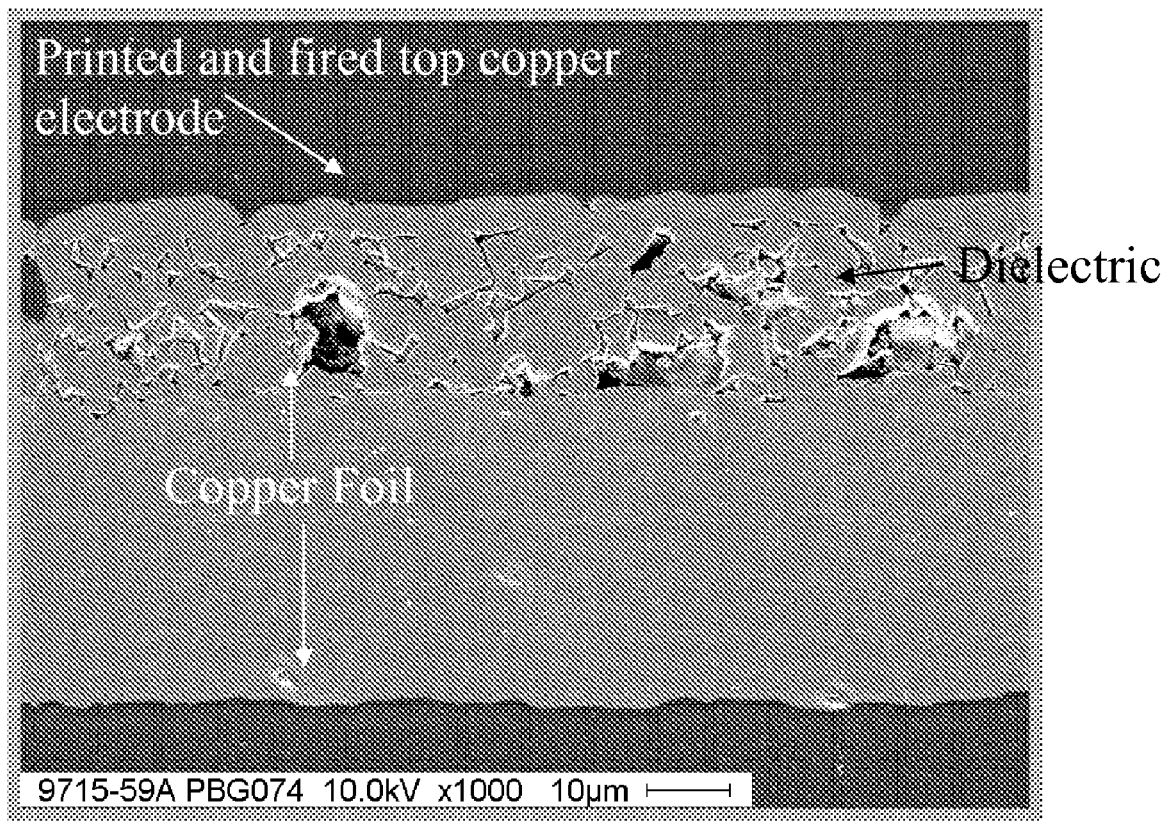
FIG. 5 illustrates a cross-section of a copper/dielectric/copper structure made by prior art methods and showing substantially incomplete densification of the dielectric.

As can be seen by comparing the cross-sections of the ceramic structures resulting from Example 1 and Example 2, as demonstrated in FIG. 4 and FIG. 5, respectively, the cross sectional density of the dielectric from Example 1 is superior to that of Example 2.

What is claimed is:

1. A method for making a capacitor having a metal/dielectric/metal structure, comprising:
   providing a fugitive substrate;
   forming a metal green tape on said fugitive substrate by casting and drying a metal slurry on said fugitive substrate, said metal slurry comprising a metal powder, an organic carrier, a binder resin and a solvent;
   and forming a dielectric layer over the metal green tape, said dielectric layer comprising barium titanate, an organic carrier, a binder, and glass;
   forming a top metal electrode over the dielectric layer; and
   removing the fugitive substrate and co-firing the metal green tape, the dielectric layer and the top metal electrode,
   resulting in the fired structure comprising a metal/dielectric/metal structure,
   wherein the dielectric comprises glass in an amount that is less than 20% by weight of the total inorganic composition of the dielectric and the dielectric achieves substantially complete densification and
   wherein the metal in the metal powder is selected from the group consisting of copper and nickel and their alloys.

2. The method of claim 1, wherein, the formed dielectric layer is a dielectric green tape, and further comprising:
   laminating the metal green tape to both sides of the dielectric green tape; and
   co-firing the metal green tape, dielectric green tape and metal green tape structure.

3. The method claim 1, wherein the fired metal in the metal/dielectric/metal structure has a thickness between 5 and 35 microns.

4. The method of claim 1, wherein the fired dielectric in the fired metal/dielectric/metal structure has a thickness between 1 and 20 microns.

5. The method of claim 1, further comprising, after firing, etching the metal on at least one side of the structure to define capacitor electrodes prior to incorporation into a printed wiring board.

6. The method of claim 1 the metal in the metal powder is copper.

7. The method of claim 1 the top metal electrode is formed by casting and drying a second metal slurry on said dielectric layer, said second metal slurry comprising a copper powder, an organic carrier, a binder resin and a solvent.

8. A method for making a capacitor having a metal/dielectric/metal structure, comprising:
   providing a first fugitive substrate;
   forming a metal green tape on said fugitive substrate by casting and drying a metal slurry on said fugitive substrate, said metal slurry comprising a metal powder, an organic carrier, a binder resin and a solvent;
   providing a second fugitive substrate;
   forming a dielectric green tape an said second fugitive substrate by casting and drying a dielectric slurry on said second fugitive substrate, said dielectric slurry comprising barium titanate, an organic carrier, a binder, a glass and a solvent removing the fugitive substrate from the dielectric green tape and laminating the metal green tape to both sides of the dielectric green tape;

removing the fugitive substrate from the metal green tape and co-firing the dielectric green tape and the metal green tape resulting in a fired structure comprising a metal/dielectric/metal structure, wherein the dielectric comprises glass in an amount that is less than 20% by weight of the total inorganic composition of the dielectric and the dielectric achieves substantially complete densification, and wherein the metal in the metal powder is selected from the group consisting of copper and nickel and their alloys.

\* \* \* \* \*